(12) United States Patent
Tien

(10) Patent No.: US 7,137,094 B2
(45) Date of Patent: Nov. 14, 2006

(54) METHOD FOR REDUCING LAYERS REVISION IN ENGINEERING CHANGE ORDER

(75) Inventor: Li-Chun Tien, Tainan (TW)

(73) Assignee: Taiwan Semiconductor Manufacturing Company, Hsin Chu (TW)

( * ) Notice: Subject to any disclaimer, the term of this patent is extended or adjusted under 35 U.S.C. 154(b) by 323 days.

(21) Appl. No.: 10/826,560

(22) Filed: Apr. 16, 2004

(65) Prior Publication Data

US 2005/0235240 A1 Oct. 20, 2005

(51) Int. Cl.
G06F 17/50 (2006.01)

(52) U.S. Cl. .............................. 716/11; 716/9; 716/10; 716/12

(58) Field of Classification Search ............... 716/9–14
See application file for complete search history.

(56) References Cited

U.S. PATENT DOCUMENTS

| 6,502,229 | B1* | 12/2002 | Lee et al. | 716/12 |
| 2003/0182649 | A1* | 9/2003 | Harn | 716/11 |
| 2006/0026546 | A1* | 2/2006 | Dinter et al. | 716/11 |

* cited by examiner

*Primary Examiner*—Paul Dinh
(74) *Attorney, Agent, or Firm*—Duane Morris LLP

(57) ABSTRACT

An engineering change order (ECO) base cell module is disclosed along with some of its applications. The cell has an N well and P well, P+ implant and N+ implant regions, N well pick-up and P well pick-up regions, a first power supply line, and a second power supply line, wherein the ECO base cell has a same configuration as a standard logic cell and is alterable in at least one metal layer for making one or more connections to form a functional logic cell.

15 Claims, 4 Drawing Sheets

METHOD FOR REDUCING LAYERS REVISION IN ENGINEERING CHANGE ORDER

BACKGROUND

The present invention relates generally to integrated circuit design revision management, and more particularly, initial repetition of a novel base cell design and routing for reducing layers revisions in Engineering Change Orders (ECOs).

Demands of consolidating functions and applications from printed circuit board to a single chip are growing stronger. These demands have made the scales and designs of integrated circuit (IC) increasingly complex and time consuming. Computer-Aided Design (CAD) has become a necessary tool to speed up and improve the quality of IC design. Of all the phases in designing application specific integrated circuit (ASIC), physical layout takes up a major portion of the design cycle.

In creating a physical layout of an ASIC, a computer layout may be first generated. Generally, the computer layout may be created by arranging a number of individual blocks or "logic cells" based on designated schematics. The functionality and design of individual logic cells may be predetermined and stored on a computer system as a standardized cell design. Such cell design techniques can save time in design cycle, as it may be no longer necessary for an IC designer to custom design each individual gate and transistor in an integrated circuit. Rather, the circuit designer breaks down a new circuit design into a number of known (or new) cell designs and then combines these cells appropriately to generate a circuit that performs a desired function. Each of the logic cells contains a number of terminals for implementing into the IC.

To release the layout to a mask making for semiconductor processing, the data is loaded in a tape, and is given to a mask shop. This is called tape-out. To tape-out such a computer layout, commercial place-and-route CAD tools are used. More particularly, place-and-route CAD programs are used 1) to arrange logic cells and other elements to optimize their interconnections and the overall size and 2) to define the routing region and to select channels to connect the logic cells and elements. A place-and-route CAD tool requires as input a predetermined number of predefined logic cell types (e.g., Inverter, NAND, NOR, XOR, Multiplexer, flip-flop, Decap, etc.) to implement the tasks mentioned above. In response, the place-and-route CAD tool outputs a computer layout.

Using the computer layout generated as a blueprint, a number of basic CMOS transistor layers, contact, and metal layers defining the elements and interconnections of the IC are created in silicon through a combination of semiconductor processes namely depositing, masking, and etching. When combined, these layers form the IC with functions. Depending on the complexity of the ASIC, each circuit may involve multiple basic layers, multiple contacts, and multiple metal layers. This layer-patterns-release procedure is widely known as tape-out.

Following tape-out, for various reasons including design changes, modifications are subsequently required to delete as well as add logic elements and interconnections from the original design. When this occurs, an engineering change order (ECO) is generated to document the desired changes. Next, the computer layout generated earlier is modified using the commercial place-and-route CAD tool to incorporate the desired changes. Under Conventional methods, extra logic cells of different types are included in the original computer layout as reserves in case new elements are needed. However, due to limitations inherent in the software environment (e.g., capability to handle a limited number of variables), the place-and-route CAD tool requires that these extra logic cells be of predefined types and numbers. Because the types of the logic cells are predefined as Inverter, NAND, NOR, XOR, Multiplexer, flip-flop, Decap, etc., modifications are limited to changing the logic cells connectivity. Such inflexibility may cause negative consequences. For embodiment, in adding logic elements as required under an ECO, a logic cell of a certain type may not be available for implementing a desired function. As a result, either the desired function must be deleted or the process of generating a computer layout with the desired logic cells must be restarted. As such, neither one of these options is desirable.

Even if the right type logic cells are available for adding, the layout engineer must still make the proper connections. Because the locations of the logic cells are fixed, it is sometimes not possible to provide the desired connections given existing obstacles and various space constraints in the layout. In addition, it is a painful and time-consuming task to identify the extra logic cells and provide the proper wiring to properly connect the added cells. Because of the increasing complexity of IC design and modification, the turn-around time to incorporate the desired ECO changes is generally high.

When what is desired is a shorter product life cycle that pushes time-to-market shorter, multimillion dollar and lengthy design cycle of high resolution mask revision become intolerable.

What is desired is a methodology and an ECO base cell that can be used for revising the same to accommodate design change.

SUMMARY

In view of the foregoing, this invention provides a method for implementing changes to a device layout design. After placing one or more standard logic cells in the layout design according to at least one preliminary design file, and one or more engineering change order (ECO) base cells are further placed in one or more spare regions. The placed standard logic cells are routed according to the preliminary design file. Then, at least one metal layer of at least one of the ECO base cells is altered to form the functional cell if such a functional cell is needed. The placed standard logic cells are rerouted to be integrated with the formed functional cell.

DESCRIPTION

In view of what is needed in the industry, a flexible ECO cell is hence created and disclosed herein. This cell can be easily applied into current auto place-and-route methodology. With this new cell and methodology, both design revision time and cost can be reduced and controlled easily. The following invention will provide a more detailed description of a flexible layout design of Engineering Change Order (ECO) base cell and its applications for chip design.

One or more base cells may be built by layout style similar to gate array library base cells. The cells have features or element configuration as the standard logic cells. For embodiment, they keep the same pitch as a standard logic cell or gate array library, symmetrical in one or more directions. Various elements such as the Nwell, Pwell, P+implant, N+implant VDD's Metal, VSS's Metal, or OD Pick-up may keep the same width and height as the standard cell in the same chip. The source, gate, and the drain side are kept floating. The base cells can be transformed into targeted logic cells like Inverter, NAND, NOR, XOR, Multiplexer, flip-flop, de-coupling capacitors (Decap), etc. by programming or altering at least one metal layer of the chip. The base cells can be placed using block level or chip level auto placement.

In an original design, one or more logic cells may be placed and connected through routing to form higher level functions, and one or more base cells may also be placed in predetermined locations as fillers to prepare for future revision needs. In design revision, the base cells can be transformed into the target cells through metals to silicon contacts, metals to polysilicon contacts, or other metal layer changes. Then, the design revision can be achieved through auto routing. The design revision cost and cycle time can be substantially reduced at the same time.

Figure 1:
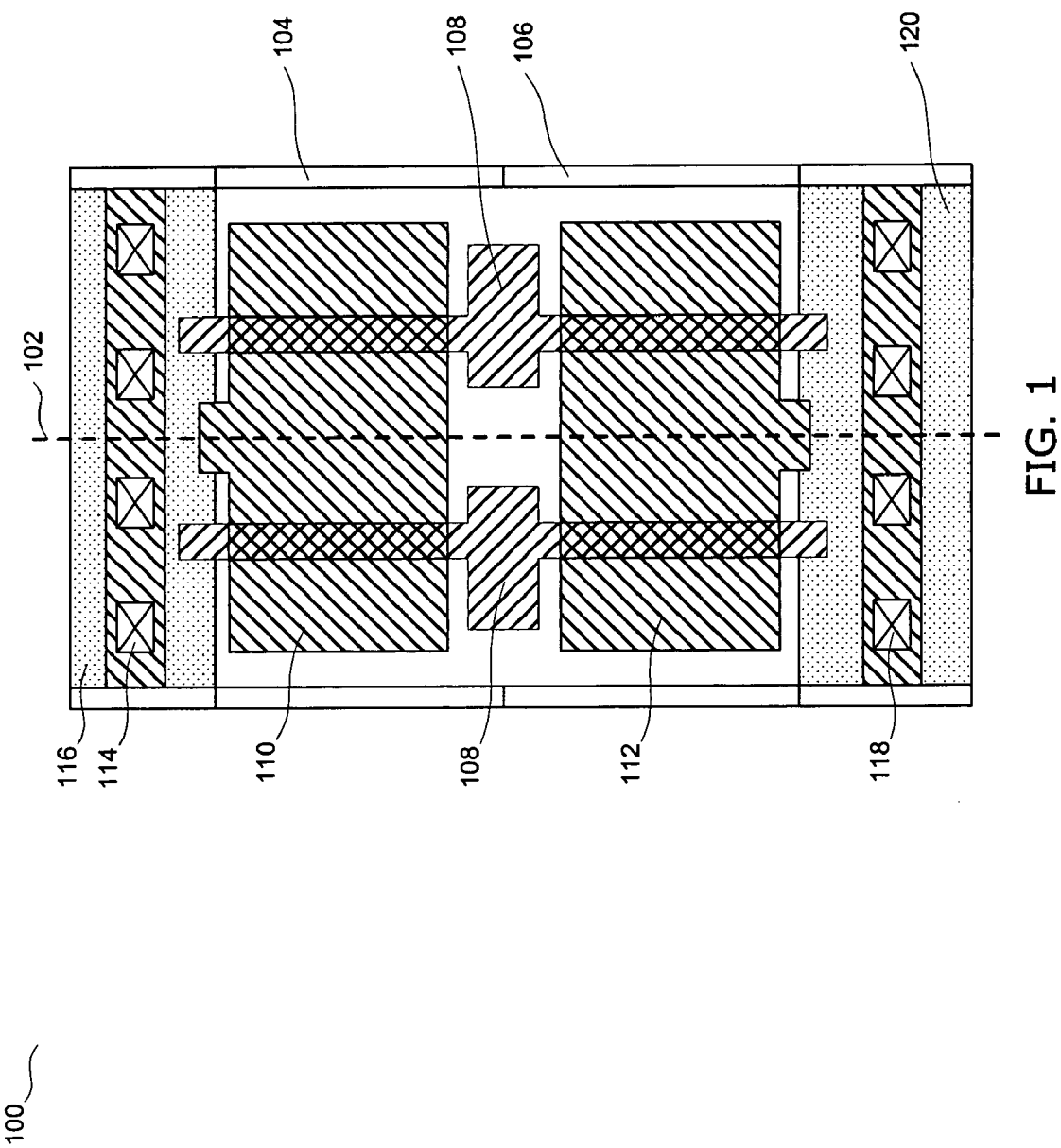
FIG. 1 illustrates an Engineering Change Order (ECO) base cell without metal line programmed in accordance with one embodiment of the present invention.

Referring now to FIG. 1, there is base cell embodiment 100 illustrating various material layers and is not routed appropriately to form a logic or functional cell yet. FIG. 1 shows the base cell with a virtual center line 102, with respect to which all patterns of material layers are mirror symmetrical. Patterns in different material layers may be formed separately with standard manufacturing processes. Since devices such as NMOS transistors and PMOS transistors can be produced in each cell, the P side and N side are defined. NWell 104 provides a pool of substrate where one or more PMOS transistors may be formed thereon. PWell 106 provides a pool of substrate where one or more NMOS transistors sit on. Polysilocon 108 together with gate oxide form MOS transistor channel region when P+ region 110 and N+ region 112 are implanted. The P+ implant forms the source and drain regions for PMOS transistors. The N+ 112 implant forms the source and drain regions for NMOS transistors. N+ implant and contacts 114 for NWell pickup connect NWell to VDD 116. Similarly, P+ implant and contacts 118 for PWell pickup connect PWell to VSS 120. VDD and VSS are provided by a pair of DC power sources as the voltage supply. It is further noted that each base cell is not connected with another base cell initially.

Figure 2:
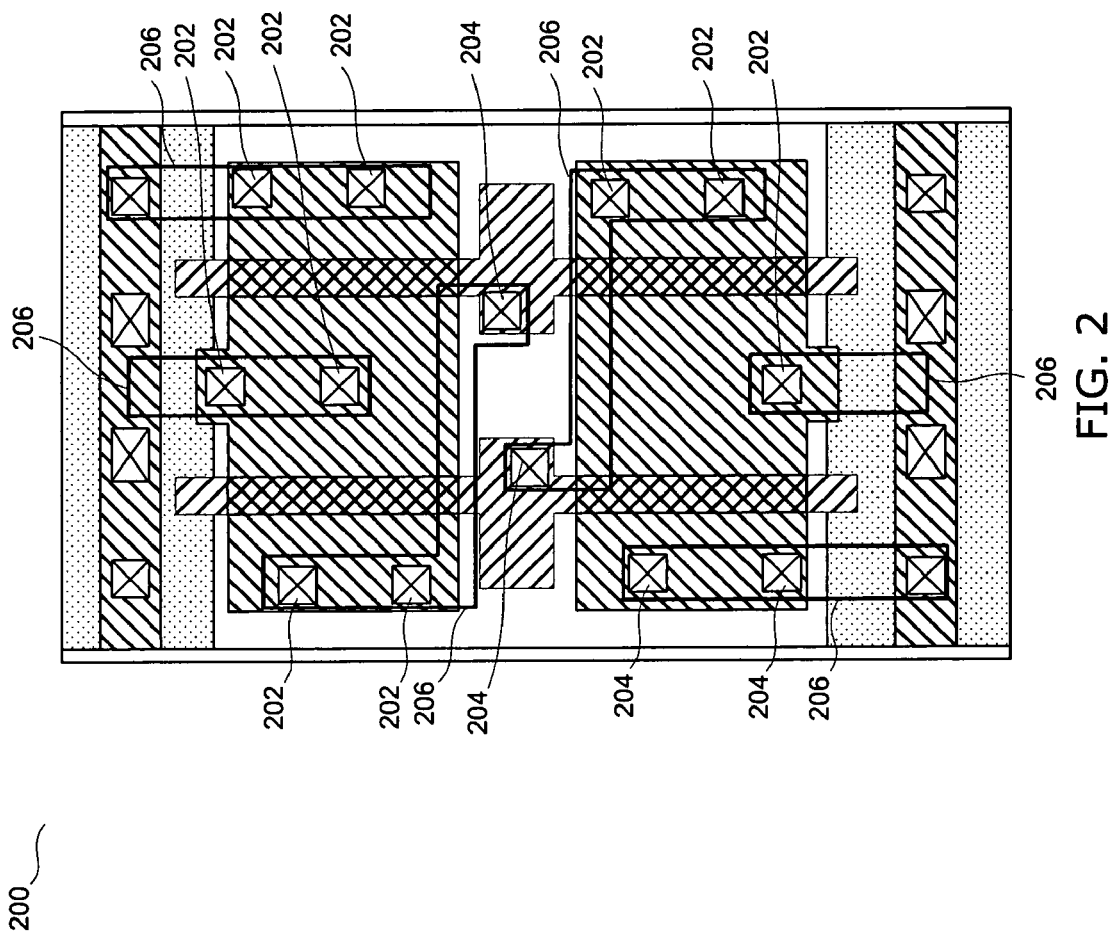
FIG. 2 illustrates an ECO base cell with metal line programmed to perform a function of de-coupling capacitor function in accordance with one embodiment of the present invention.

FIG. 2 illustrates how a basic cell 100 is transformed into a logic cell 200 by adding extra patterns in metals to silicon contacts 202, metals to polysilicon contacts 204 and metal layer 206. The extra patterns in these material layers may be used to route the transistors to form logic functions such as a de-coupling capacitor shown in this FIG. 2. This routed logic cell is shown in contrast to a floated base cell 100 to shown the differences. Based on what the logic cell is, different patterns of routing in one or more material layers of silicon contacts 202, metals to polysilicon contacts 204 and metals 206 will be implemented according to schematic designs.

Figure 3:
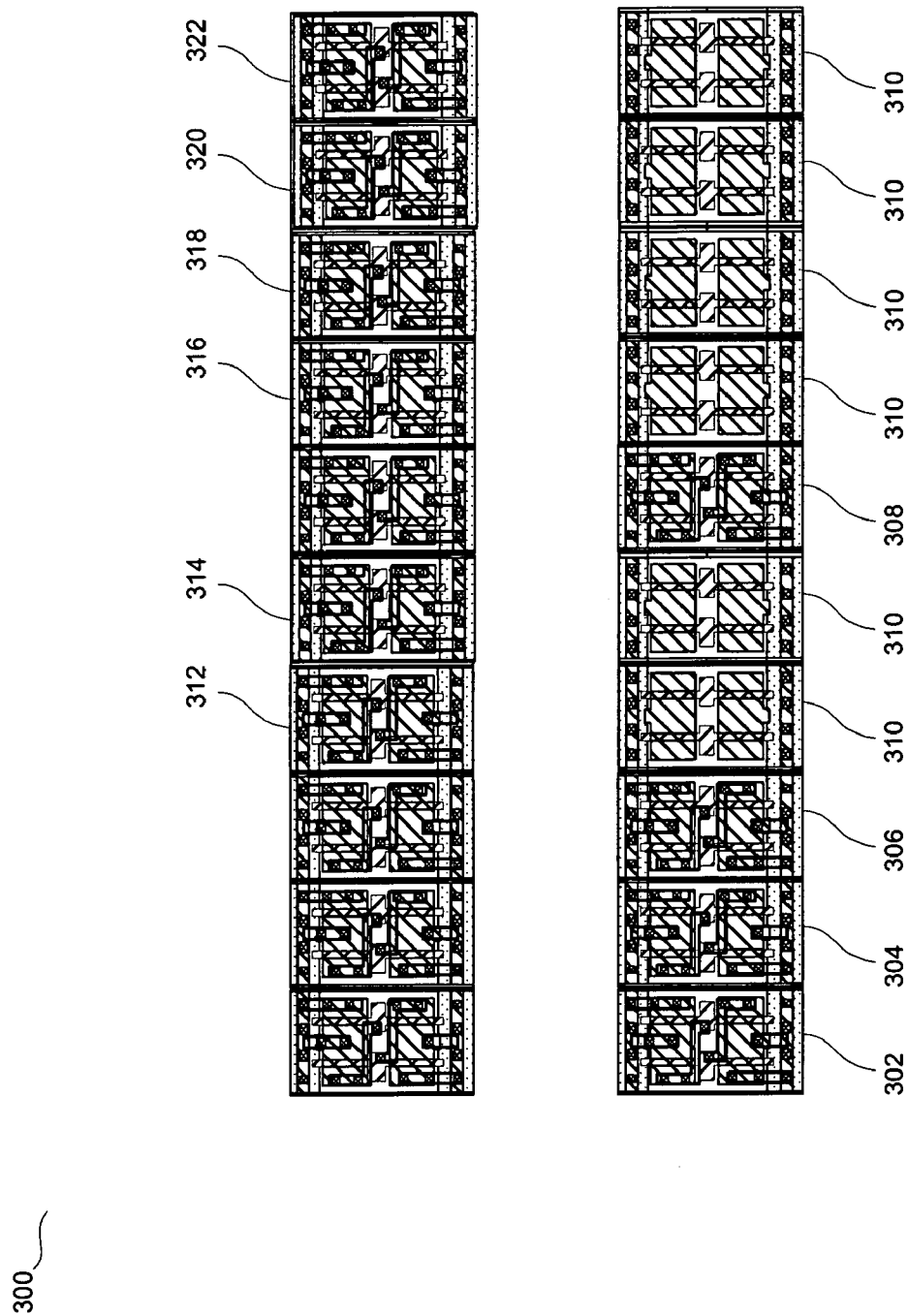
FIG. 3 presents a layout of combination of ECO base cells and standard logic cells and the transformation of the ECO base cells in accordance with one embodiment of the present invention.

FIG. 3 illustrates a portion of a circuit layout 300 with base before and after the base cells have been altered to form logic cells in accordance with one embodiment of the present invention. The bottom section shows the portion of circuit before any ECO revision, and the top section shows the same portion of the circuit after the revision. The circuit 300 uses four routed logic cells, 302, 304, 306, and 308 in different locations, and has several un-routed base cells 310 arranged in spare regions as filler cells. Initially, the unused base cells may be used to preserve spaces to add flexibility in future ECO revision that might need additional transistors. When there is a need to make revision of the design, the base cells are to be altered by changing one or more layers of metals to silicon contacts 202, metals to polysilicon contacts 204 and metals 206. In this embodiment, logic cells 312, 314, 316, 318, 320, 322 may be made from the respective base cells 310.

Figure 4:
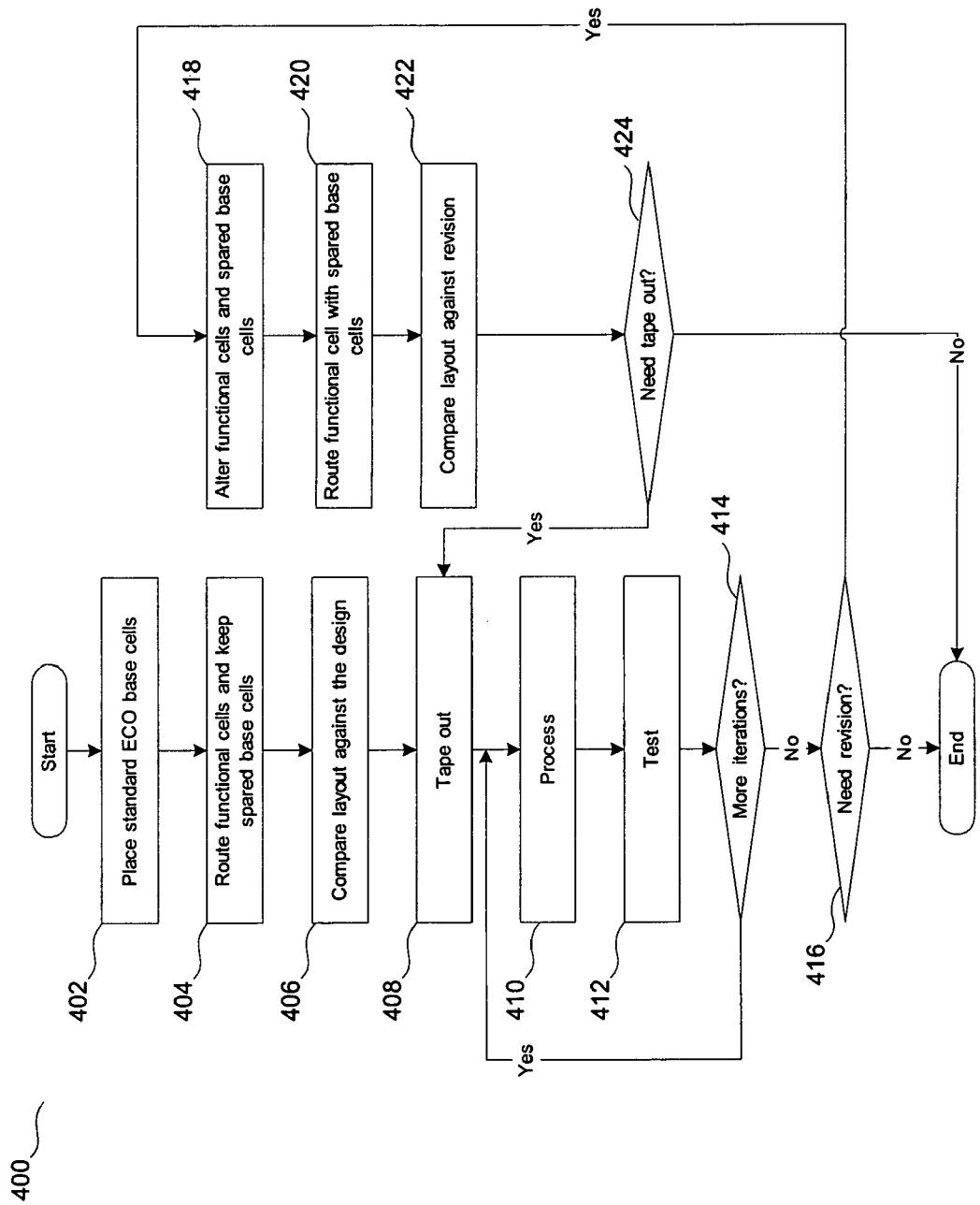
FIG. 4 illustrates a flow diagram for implementing a simplified design change using the ECO base cells in accordance with one embodiment of the present invention.

FIG. 4 presents a flow chart 400 illustrating a simplified design change technique in accordance with one embodiment of the present invention. The flow starts in the step 402, where one or more standard cells and ECO base cells are placed according to the needs of the preliminary design file. The ECO base cells are placed in spare regions of the circuit. In the step 404, standard cells are routed to form one or more functional cells, while one or more base cells are spared and preserved. In the step 406, the layout is compared against the preliminary design file. In the step 408, the device as specified in the layout will then be ready to tape out and go through one or more iterations of the step 410, where the design is processed, and of the step 412, where the design is tested. The step 414 determines whether the design needs further iterations of the steps 412 and 414. For embodiment, a revision design file may be compared against the preliminary design file to see any changes needed, and whether these changes can be made by using the ECO base cells. If no further processing and testing is needed, the flow goes to the step 416, where it is determined if the device design may need to be changed. If the design does not need to be changed, the flow ends. Alternatively, if the design needs to be changed and the ECO base cells can be used for the change, at least one metal layer of at least one spared base cell is revised in the step 418. The altered ECO base cells are now the functional logic cells. In the step 420, the functional cells are re-routed with the altered ECO base cells. In the step 422, the layout is further compared with the revised design. In the step 424, it is determined if the flow needs further tape-out. If further tape-out is required, the flow goes back to the step 408. If no further tape-out is required, the flow ends.

Although the invention is illustrated and described herein as embodied in a method and design for, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

The above invention provides many different embodiments or embodiments for implementing different features of the invention. Specific embodiments of components and processes are described to help clarify the invention. These are, of course, merely embodiments and are not intended to limit the invention from that described in the claims.

What is claimed is:

1. A method for implementing changes to a device layout design, the method comprising:
   placing one or more standard logic cells in the layout design according to at least one preliminary design file;
   placing one or more engineering change order (ECO) base cells in one or more spare regions;
   routing the placed standard logic cells according to the preliminary design file;
   altering at least one metal layer of at least one of the ECO base cells to form the functional cell if such a functional cell is needed; and
   re-routing the placed standard logic cells to be integrated with the formed functional cell.

2. The method of claim 1 wherein the altering further includes altering a metal contact layer.

3. The method of claim 1 wherein the ECO base cells have the same element configuration as the standard logic cells.

4. The method of claim 3 wherein the ECO base cells have a same layout pitch as the standard logic cells.

5. The method of claim 3 wherein each of the ECO base cells has N well, P well, P+ implant, N+ implant, N well pick-up, and P well pick-up regions arranged in the same configuration as the standard logic cells.

6. The method of claim 1 wherein each of the ECO base cell is symmetrical in its structure.

7. The method of claim 4 wherein the ECO base cell is symmetrical along a virtual center line from a PMOS side to an NMOS side of the ECO base cell.

8. The method of claim 4 wherein the ECO base cell is symmetrical along a virtual center line from a first power supply line to a second power supply line of the ECO base cell.

9. The method of claim 1 wherein the placing one or more ECO base cells in one or more spare regions further includes placing the ECO base cells as filler cells.

10. The method of claim 1 wherein the placing one or more ECO base cells in one or more spare regions further includes placing the ECO base cells as de-coupling capacitor cells.

11. A method for implementing changes to a device layout design, the method comprising:
    placing one or more standard logic cells according to at least one preliminary design file;
    placing one or more engineering change order (ECO) base cells in one or more spare regions;
    routing the placed standard logic cells according to the preliminary design file;
    comparing a modified design file against the preliminary design file to determine a need for at least one additional functional cell;
    altering at least one metal layer of at least one of the ECO base cells to form the functional cell; and
    re-routing the placed standard logic cells to be integrated with the formed functional cell,
    wherein the ECO base cells have the same element configuration as the standard logic cells, and are symmetrical along a virtual center line from a PMOS side to an NMOS side thereof.

12. The method of claim 11 wherein the ECO base cells have a same layout pitch as the standard logic cells.

13. The method of claim 11 wherein each of the ECO base cells has N well, P well, P+ implant, and N+ implant, N well pick-up, and P well pick-up regions arranged in the same configuration as the standard logic cell.

14. The method of claim 11 wherein the placing one or more ECO base cells in one or more spare regions further includes placing the ECO base cells as filler cells.

15. The method of claim 11 wherein the placing one or more ECO base cells in one or more spare regions further includes placing the ECO base cells as de-coupling capacitor cells.

* * * * *